US007446478B2

(12) United States Patent
Syratchev

(10) Patent No.: US 7,446,478 B2
(45) Date of Patent: Nov. 4, 2008

(54) KLYSTRON AMPLIFIER

(75) Inventor: Igor Syratchev, Geneva (CH)

(73) Assignee: European Organization for Nuclear Research, Geneva (CH)

( * ) Notice: Subject to any disclaimer, the term of this patent is extended or adjusted under 35 U.S.C. 154(b) by 0 days.

(21) Appl. No.: 10/583,026

(22) PCT Filed: Dec. 19, 2003

(86) PCT No.: PCT/EP03/14805

§ 371 (c)(1),
(2), (4) Date: Jan. 26, 2007

(87) PCT Pub. No.: WO2005/059946

PCT Pub. Date: Jun. 30, 2005

(65) Prior Publication Data

US 2007/0146084 A1 Jun. 28, 2007

(51) Int. Cl.
*H01J 25/10* (2006.01)
*H03B 9/04* (2006.01)

(52) U.S. Cl. ........................ 315/5.39; 315/5.41; 331/83

(58) Field of Classification Search ................ 315/5.39, 315/5.41, 502, 505, 5, 500; 330/43–45; 331/6, 331/81, 83
See application file for complete search history.

(56) References Cited

U.S. PATENT DOCUMENTS 3,390,300 A * 6/1968 Mack ........................ 315/5.21
4,024,426 A * 5/1977 Vaguine ...................... 315/5.41
4,300,105 A * 11/1981 Busacca et al. ............... 331/83
4,827,192 A 5/1989 Tran et al. .................. 315/5.39
5,132,638 A * 7/1992 Friedman et al. .............. 330/45
5,235,249 A * 8/1993 Mourier ...................... 315/5.14
5,280,216 A * 1/1994 Mourier ......................... 315/5
5,469,022 A * 11/1995 Begum et al. .............. 315/5.39
5,541,391 A * 7/1996 Seong ........................ 219/761
5,698,949 A * 12/1997 Lien et al. .................. 315/5.31
5,811,943 A * 9/1998 Mishin et al. ............... 315/505

* cited by examiner

*Primary Examiner*—David Hung Vu
*Assistant Examiner*—Tung X Le
(74) *Attorney, Agent, or Firm*—Hamilton, Brook, Smith & Reynolds, P.C.

(57) ABSTRACT

A klystron has a plurality of electron beam paths and plural damped disc-shaped cavities. The plurality of electron beam paths cut the cavities and the Klystron amplifier further comprises an annular input cavity and an annular output cavity disposed around the substantially circular external periphery of respective disc-shaped cavities, and in communication with it. The output cavity is arranged to receive RF power from the electron beams, wherein the cavities are arranged to support one of a single resonant rotating wave in a whispering-gallery mode, and a single resonant standing wave in a whispering-gallery mode.

26 Claims, 7 Drawing Sheets

KLYSTRON AMPLIFIER

RELATED APPLICATIONS

This application is the U.S. National Stage of International Application No. PCT/EP2003/014805, filed Dec. 19, 2003, published in English.

TECHNICAL FIELD

The present invention relates to a klystron amplifier, to a window arrangement for a multibeam klystron amplifier and to a super-multibeam kylstron.

Klystron amplifiers, also known herein as klystrons, are well known devices. There is currently a need for a high power kylstron having embodiments which are capable of operating in the range 900-1000 MHz, with high power conversion efficiency, with strong damping of higher-order modes and with a good lifetime.

BACKGROUND

Known designs all have defects or deficiencies in one or more of these areas and it would therefore be desirable to provide a klystron amplifier embodiments of which can be designed to meet the above criteria.

According to a first aspect of the present invention there is provided a klystron amplifier comprising means defining a plurality of electron beam paths and means defining plural damped disc-shaped cavities, wherein the plurality of electron beam paths cut the cavities and the Klystron amplifier further comprises an annular input cavity and an annular output cavity disposed around the substantially circular external periphery of respective disc-shaped cavities in communication therewith, the output cavity is arranged to receive RF power from the electron beams, wherein the cavities are arranged to support one of a single resonant rotating wave in a whispering-gallery mode, and a single resonant standing wave in a whispering-gallery mode.

SUMMARY

An embodiment further comprises a wall defining a substantially disc-shaped cavity, the wall having one or more apertures for coupling thereto of electron beam energy, the cavity wall having a substantially circular outer periphery permitting coupling to a substantially annular input or output wave guide, wherein the said coupling is afforded by a plurality of windows distributed along the external periphery of the disc-shaped cavity.

Each window may comprise a ceramic member secured to a waveguide wall.

An embodiment may comprise an input cavity, two gain cavities, a second harmonic cavity and an output cavity.

In an embodiment, at least one cavity has an RF absorber member disposed therein.

In an embodiment, each cavity has a vacuum port.

In an embodiment, the port is axial.

In an embodiment, the port has a diameter around 40 cm.

An embodiment of a klystron has a circular RF absorber member.

In an embodiment, the absorber is of SiC, and extends outwardly from the port by a small amount, disposed with its outer radius such that the operating mode of the cavity is virtually unaffected.

An embodiment is arranged to operate in a $TM_{m,n,q}$ mode

In an embodiment, m=11

An embodiment has plural beam tubes.

An embodiment has one focussing solenoid per beam tube

An embodiment is arranged to operate in the frequency range 900-1000 MHz.

An embodiment is arranged to operate at substantially 937 MHz

In an embodiment, a klystron is arranged to provide tens of megawatts.

An embodiment is arranged to provide about 50 MW.

An embodiment has a waveguide around each input and output cavity.

An embodiment is arranged to operate with a power conversion efficiency over 65%

An embodiment is arranged to operate with a power conversion efficiency of over 70%

In an embodiment, the transverse beam spacing in a cavity is about half a wavelength.

In an embodiment, the diameter of the beam pipe is small

In an embodiment, the diameter is about 1/16 of the operating wavelength.

An embodiment is arranged to operate in a having a common vacuum pump and operating at $10^{-8}$ mbar or better.

According to a second aspect of the present invention there is provided a Klystron amplifier having a wall defining a substantially disc-shaped cavity, the wall having one or more apertures for coupling thereto of electron beam energy, the cavity wall having a substantially circular outer periphery permitting coupling to a substantially annular input or output wave guide, wherein the said coupling is afforded by a plurality of windows distributed along the external periphery of the disc-shaped cavity.

According to another aspect of the invention, there is provided a super multibeam klystron comprising a klystron of the first or second aspect wherein there are plural sets of beams, each set having plural beams, and each set cuts each cavity at a respective aperture.

Exemplary embodiments to the inventions will now be described with reference to the accompanying drawings in which:

DETAILED DESCRIPTION OF CERTAIN EXEMPLARY EMBODIMENTS

The properties of klystrons are fairly well known and current experience is that a Klystron capable of supplying high power at high efficiency is best embodied as a multibeam Klystron. This is because having a greater number of beamlets in a klystron enables the power per beamlet to be reduced which leads to lower current density and a sufficiently low perveance per beam. Beam perveance which is the current perveance divided by the 3 over 2 power of the voltage strongly influences the power conversion efficiency.

It has been shown that for very low perveance devices efficiencies in excess of 80% may be attained.

Accordingly a multibeam klystron was selected as appropriate for the desired application. Commercially available solid-state RF amplifiers are available at the design frequency range to act as input power source, and these can reliably produce 300 W. In an embodiment for providing 50 MW peak output power, an overall gain of 53 dB is then required from the klystron RF structures. The embodiment then typically consists of 5 cavities: an input cavity, two gain cavities, a second harmonic cavity and an output cavity.

Figure 1:
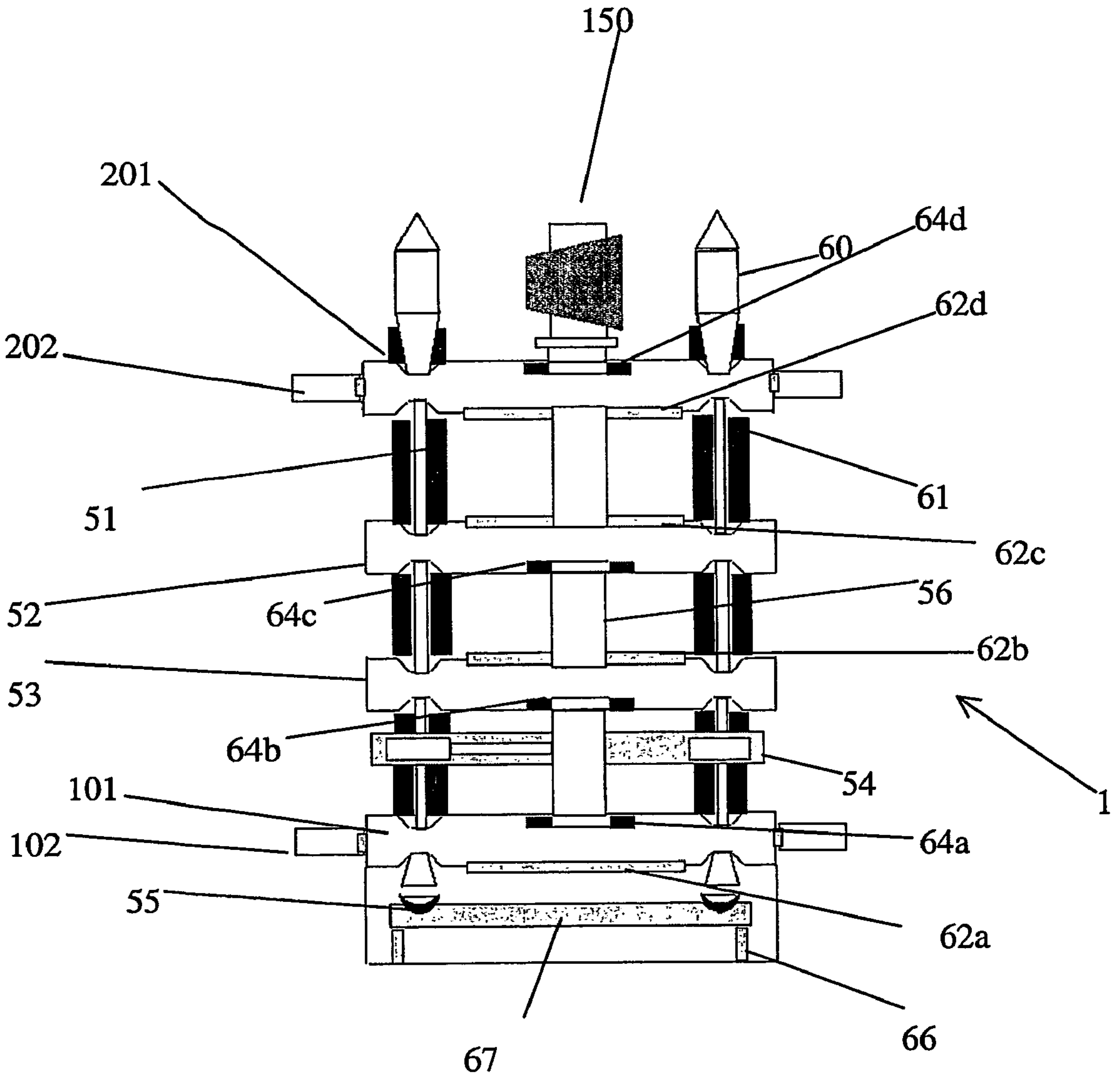
FIG. 1 shows a side elevation of a klystron embodying the invention.

Referring to FIG. 1 a multibeam klystron (1) includes a number of beam tubes (51) disposed on a substantially circular path about a central axially-disposed vacuum channel (56). Each of the beam paths is confined in a respective beam tube (51) which extends longitudinally of the klystron (1) from a respective cathode (55) disposed at the base of the Klystron (1) to a common collector (60) disposed a the top of the Klystron (1).

Close to the base of the Klystron (1) the electron tubes open into an input cavity (101) which will be described more fully later herein with respect to FIG. 3, the input cavity having an input wave guide (102) for supplying energy thereto. The beam tubes (51) extend from the top side of the input cavity (102) into a second harmonic cavity structure (54) (which will again be described more fully herein) and from the top side of the second harmonic cavity (54) to open into the lower wall of a first gain or bunching cavity (53). The beam tube then continues from the top side of the first bunching cavity (53) to open into a second gain or bunching cavity (52). The tube continues from the upper wall of the second bunching or gain cavity (52) into an output cavity (201). The common collector structure (60) extends upwardly from the top wall of the output cavity (201). The output cavity (201) has an output wave guide (202) associated with it.

Solenoid coils (61) are disposed around each of the beam tubes for focusing the beam in each tube.

Each of the input (101), output (201) and bunching (52, 53) cavities has a respective fine tuning member (621-62*d*) and a respective RF absorber (64*a*-64*d*) disposed around its vacuum port. These will be more fully described later herein. The common vacuum channel (56) is, in this embodiment, pumped by a common vacuum pump (150) which is adapted to provide a good level of vacuum, typically 10 exp-8 mbar or better.

Taking as a vertical axis the common vacuum channel (56), each of the cavities, namely the input cavity (101), the second harmonic cavity (54), the bunching cavities (52, 53) and the output cavity (201), are disposed neutrally parallel and in respective horizontal planes. A high voltage ceramic seal (66) supports a member (67) which carries the cathodes (55).

Four different klystron cavity arrangements will now be compared (see FIG. 2). FIGS. 2*a* and 2*d* depict modes in a disc shape (radial) cavity, while FIGS. 2*b* and 2*c* represent modes in an annular (waveguide type) cavity. These modes have very different R/Q values (R/Q gives the square of the voltage as seen by the beam for a given stored energy in the cavity).

One prior MBK has a simple $TM_{0,1,0}$ (pillbox) cavity. In embodiments of this prior design, the beamlets (typically between 6 and 30) pass through the cavity at different angular (and possibly also different radial) positions, close to the central maximum of the axial electric field. With these devices, very high efficiencies (80%) have been demonstrated, but they have been achieved for relatively low RF power levels (tens of kW). Getting a higher power out of this device would require an increase in the beam current, which for this geometry is soon limited by both space charge effects and cathode loading.

Figure 2A:
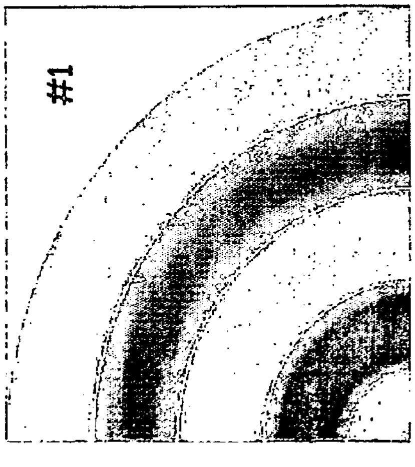
FIGS. 2*a*-2*d* show possible field distributions for klystron cavities.

One way around this limitation is to change the operating mode of the cavity to a higher radial index mode—one known device, a 1.3 GHz, 10 MW, 6-beam MBK for example, uses the $TM_{0,2,0}$ mode (see FIG. 2*a*). Another way was studied for a 1.5 GHz, 2 GW, 10-beam MBK. The design was based on the lowest mode of a ring cavity (see FIG. 2*b*.)

Figure 2B:
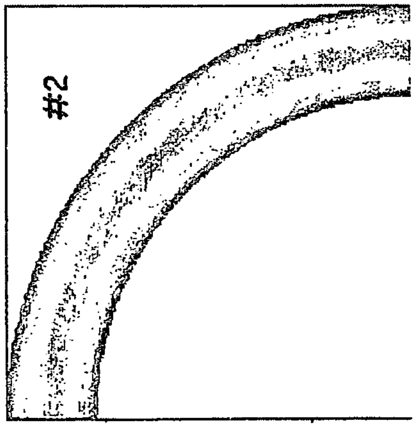
Figure 2C:
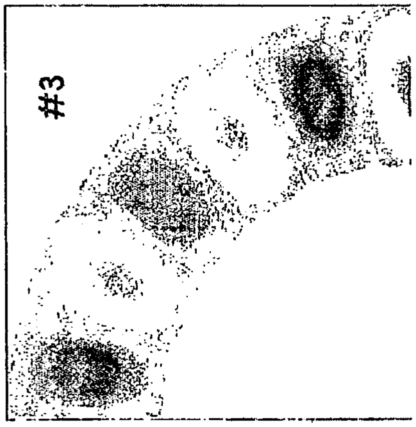

Finally, a 150 MW, X-band, 6-beam MBK was proposed by another team, based on a $TM_{12,1,0}$ waveguide mode (see FIG. 2*c*).

Since it can be shown that for all values from n=3 the $TM_{m,1,0,}$ (m=11) is more efficient than $TM_{0,n,0,}$ the present invention has a disc-shaped cavity, and preferred embodiments use a high-azimuthal-order $TM_{m,1,0}$ mode. An embodiment has 27 beams (see FIG. 3*d*). In this device the total number of beamlets is equal to about twice the index m of the operating mode.

Another very important issue for an MBK design is the parasitic mode spectrum. A strong damping of higher-order modes (HOMs) is absolutely necessary. During operation, the currents of individual beamlets will not in general be exactly balanced, and there will be a danger that any parasitic mode that has a corresponding angular current profile, or a parasitic-mode frequency close enough to the operating one, will be self-excited. It is clear that this problem will be particularly serious for devices as shown in FIG. 2*a* where it is difficult to apply any damping technique and devices as shown in FIG. 2*b* because the operating mode is at the cut-off frequency of the waveguide, resulting in a very dense HOM spectrum.

Figure 2D:
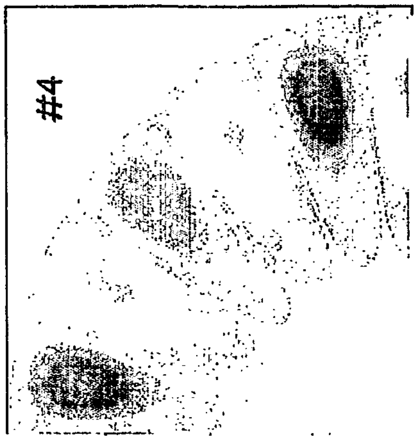

It is thus seen that devices as in FIGS. 2*a* and 2*b* have serious limitations for high-power applications, and in consequence further discussion is confined to devices as shown in FIGS. 2*c* and 2*d*.

A comparison of the impedances of $TM_{m,1,0}$ modes shows that for azimuthal indices around 10, the impedances for both cases are identical. However, the disc cavity has a much denser spectrum compared to the ring cavity. There seems to be no easy way to damp the HOMs of the ring cavity, since damping must be non-resonant; this is why measures like choke trapping, etc. do not apply. On the other hand, the field pattern of the operating mode in a disc cavity allows for the use of RF absorbers (64) to provide a damped-disc cavity, as will be further described later herein with respect to FIG. 3. It has been shown that the mode spectrum of $TM_{m,n,q}$ modes with large m ("whispering gallery" modes) can easily be made extremely sparse. As is known to those skilled in the art, a major property of whispering gallery modes is that the majority of the energy is at or close to the outer wall of a curved cavity or waveguide.

Figures 3A, 3B:
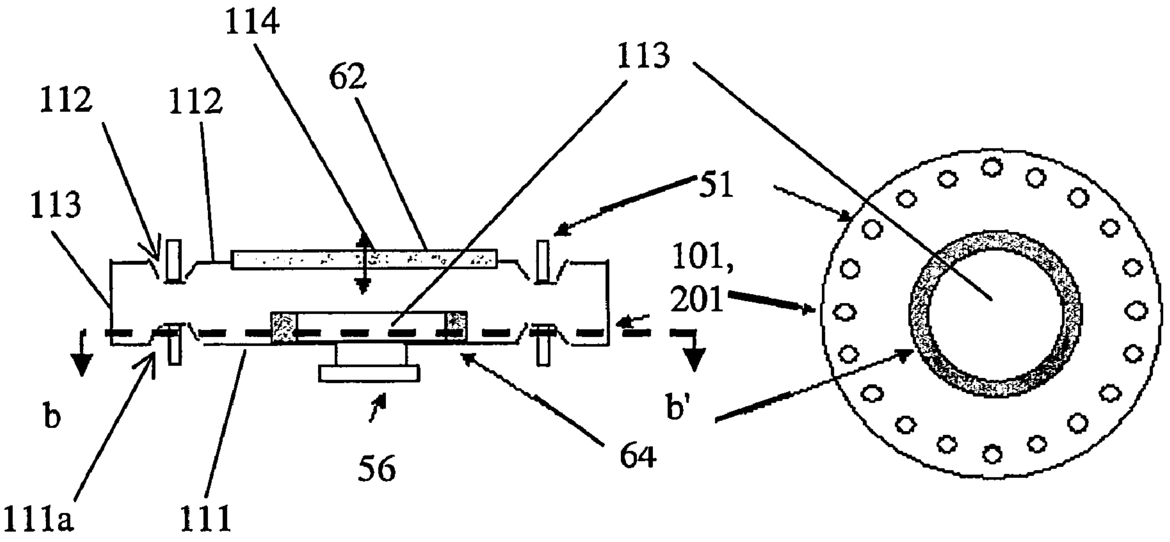
FIGS. 3*a* and 3*b* shows cross-sections through disc-shaped cavities of the klystron of FIG. 1.

Referring to FIGS. 3*a* and 3*b*, the form of the input (101) and output (102) cavities will now be explained more fully. FIG. 3*a* shows a vertical cross-section through an exemplary cavity along a plane passing through the axis. FIG. 3*b* shows a horizontal cross-section through the cavity along the line b-b'.

Referring to both figures, it will be seen that the cavities (101,102) are each defined by a generally closed generally circular-cylindrical wall (110), forming a structure having a lower generally circular wall portion (111), an upper generally circular wall portion (112) and a cylindrical peripheral wall portion (113). The peripheral wall portion (113) allows for transfer therethrough of e.m. energy via one or more so-called "windows" as will be later described herein. In an embodiment, again as will later be described herein there is a multiple plurality of mini windows.

Further reference to FIGS. 3*a* and 3*b* shows that the lower wall portion (111) has a central port (113) with a circular aperture for connection of the common vacuum channel (56). Around the port is disposed a circular RF absorber member (64) e.g. of SiC, which extends outwardly from the port (113) by a small amount. The outer radius of the RF absorber member (64) is such that the operating mode of the cavity is virtually unaffected. The function of the RF absorber is to reduce higher order radial index modes. In an embodiment, a SiC absorber ring was placed at a position which produced a 10% reduction of the operating mode Q-factor from $3.3\times10^4$ to $3.0\times10^4$. The Q-factors of all modes with a radial index higher than 3 were reduced by a factor of more than 1000 in the frequency band investigated. It is assumed that a Q-factor reduction of about 100 is enough to eliminate any effects on the beam. The upper wall portion (112) likewise has an axial circular port (114) surrounded by a fine tuning member (62) for frequency tuning. The upper and lower wall portions (111,112) are each mainly planar, but each wall has a concentric annular inwardly dished region (111*a*, 112*a*) at the same radial position for connection thereto of the beam pipes (51).

In the embodiment under discussion the diameter of the beam pipe is small (~1/16 of the operating wavelength) and takes advantage of the low single-beam current and low frequency. As a result fringe fields decay very rapidly resulting in a quasi-rectangular longitudinal electric field distribution. Also the electric field remains very constant, within 0.1%, across the beam waist (λ/32). One can see that to some extent (viewed by each single beam), the damped disc cavity (101, 201) behaves like a gridded gap.

The inter-beam space charge effects are minimised by the fact that the transverse beam spacing in a cavity is about half a wavelength (~16 cm). A good level of vacuum is necessary ($10^{-8}$ mbar or better) to avoid beam instabilities due to ionisation of residual gas. The damped disc cavity, unlike the other geometries, can be very well pumped by mounting a high vacuum conductivity port (diameter ~40 cm) on the central part of the cavity. For the gain/bunching cavities (52), the cavity impedance can be adjusted to the required value by a careful dimensioning of the RF absorber.

Figure 4A:
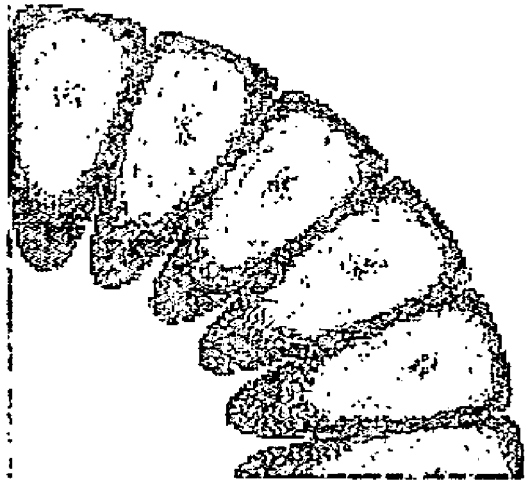
FIGS. 4*a* and 4*b* show filed distributions for a standing wave operating mode of an input/output cavity and a rotating wave operating mode of an input/output cavity.
Figure 4B:

Klystron cavities normally operate in a standing wave (SW) regime. In some devices, the output cavity is a travelling-wave structure section where energy propagates in the longitudinal direction. However with the damped disc cavity in embodiments of the invention a resonant rotating wave (RW (rotating wave)) regime is established, which can be viewed as superposition of two standing waves shifted in space and time by a quarter of a period. The resulting wave travels along the outer cavity wall in a rotating mode. Complex amplitudes of the damped disc cavity electric field for the SW and RW (rotating wave) regimes are shown in FIGS. 4*a* and 4*b*.

The RW (rotating wave) regime brings certain advantages. First of all, the number of beamlets is decoupled now from the azimuthal index of the operating mode and can be arbitrarily chosen, as with the $TM_{0,n,0}$ mode. In embodiments the number of beamlets chosen is odd so that the coupling of beam current to the modes that have closest azimuthal indices will be additionally reduced. In tests, compared to SW, the RW (rotating wave) regime, for the same operating mode, reduces the single beam current by 25%, so ensuring a higher efficiency.

As later described with reference to FIG. 5*a*, in embodiments coupling to the input and output cavities is by a rectangular waveguide (304) running peripherally around the entire cavity (302). The cut-off frequency of the feeder (waveguide width) is chosen such that the phase velocities of the waves in both the waveguide and the cavity are identical at the operating frequency. As later described with reference to FIGS. 5*a* and 5*b*, coupling to the cavity (302) is made through many small coupling holes (320) in the wall (301) between the cavity and the waveguide (304). In a preferred embodiment the distance between coupling holes is equal to a quarter of the operating mode wavelength—the total number of holes is therefore 4×m. Such a configuration provides a good matching to the cavity and reduces the probability of breakdown.

Turning now to FIG. 5, the window arrangement of the preferred embodiment will now be described. Klystron ceramic output windows are probably the most delicate RF components in the whole system. Statistics for 10 years for example, showed that about 25% of all klystron malfunctions were caused by RF window breakdown. In the described embodiment a multi-megawatt, mini-windows concept is used to exploit the properties of the damped disc cavity operating mode.

Figure 5A:
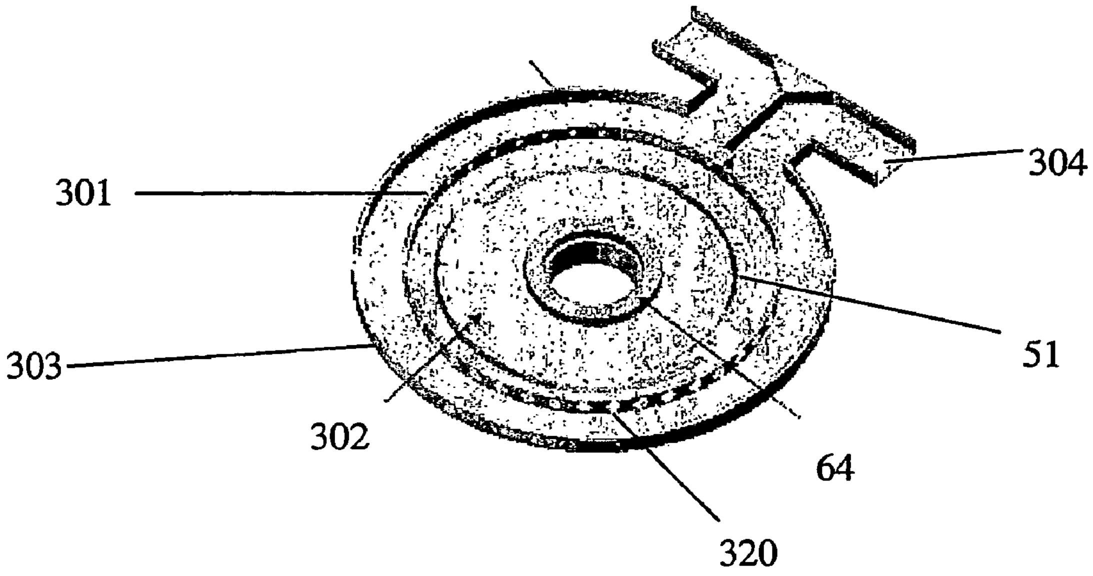
FIGS. 5*a* and 5*b* show an output cavity with plural windows through an output wave guide, and details of the window mounting.
Figure 5B:
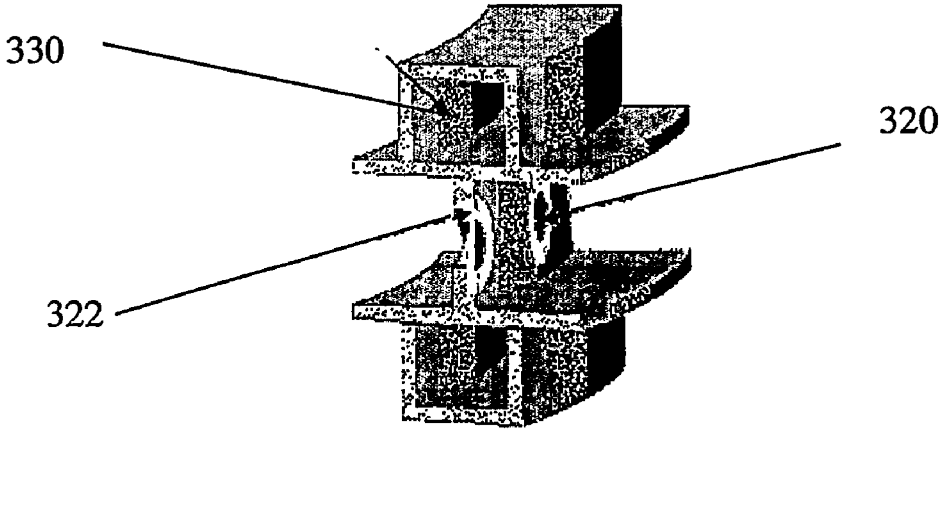

The "window" is in fact a series of many mini-windows, each covering an individual coupling hole as shown in FIG. 5*a*. Each single mini-window (320) is first brazed into its own support (322) and then is electron-beam welded, or even clamped, into the inner wall (301) of the waveguide (304). Typical dimensions of the ceramic disc are 2 mm thickness and about 30 mm diameter. The damped disc cavity field configuration is such that there is no notable electric field at the mini-window location. In the RW (rotating wave) mode, with 433 m mini-windows, the local power flow density will be reduced dramatically. For example with m=11 and P=50 MW, only 1.14 MW will be transferred through each window. Embodiments have high reliability. Following the MBK RF configuration, a system of individual solenoids (61) for each beamlet is used. By way of example, a focusing magnetic field of 600 G to 700 G is needed to steer each 150 kV, 15 A beam. A conventional solenoid requires about 1 kW per beamlet and this will reduce the overall klystron efficiency. In alternative embodiments PPM focusing methods are used, similar to those developed for the SLAC X band klystron.

The current density is the parameter that defines the cathode configuration. It is exponentially proportional to the temperature, and also inversely proportional to the exponential of the work function of the cathode material [Richardson-Dushman equation]. To keep beam compression as low as possible cathode loading is desirably increased, but this would increase the surface temperature and reduce the lifetime. Oxides of alkaline earth metals such as barium and strontium are added to the tungsten cathode to reduce operating temperatures. The lifetime of a klystron is primarily determined by cathode end-of-life emission, a result of barium depletion at the cathode surface.

Since the klystron has been conveniently divided up into separate beamlets that can be considered as stand-alone klystrons in parallel, some embodiments use individual collectors for each beamlet. However, the cooling of such a device becomes complicated when about 30 small collectors are connected up in parallel to a common water supply and this also appears to be expensive to manufacture. The important design parameters for the collector are the mean and peak power to be dissipated, and the surface area on which the electron beam impinges. The minimum amount of cooling water (turbulent flow) required is generally estimated as 3 liters/minute for each kilowatt of average RF power dissipated. As a result, and as shown in FIG. 1, in the preferred embodiment a common collector (60), with each beam passing through its own pole piece at the output end of the tube, and allowed to expand in this magnetic-field-free region, is employed.

The overall gain (the ratio of peak output power to input drive power) will determine the minimum number of cavities that will be required. Where a small bandwidth is needed, for example ±3%, it can be assumed that all gain cavities are tuned to approximately the same fundamental frequency and not stagger tuned.

Figure 6:
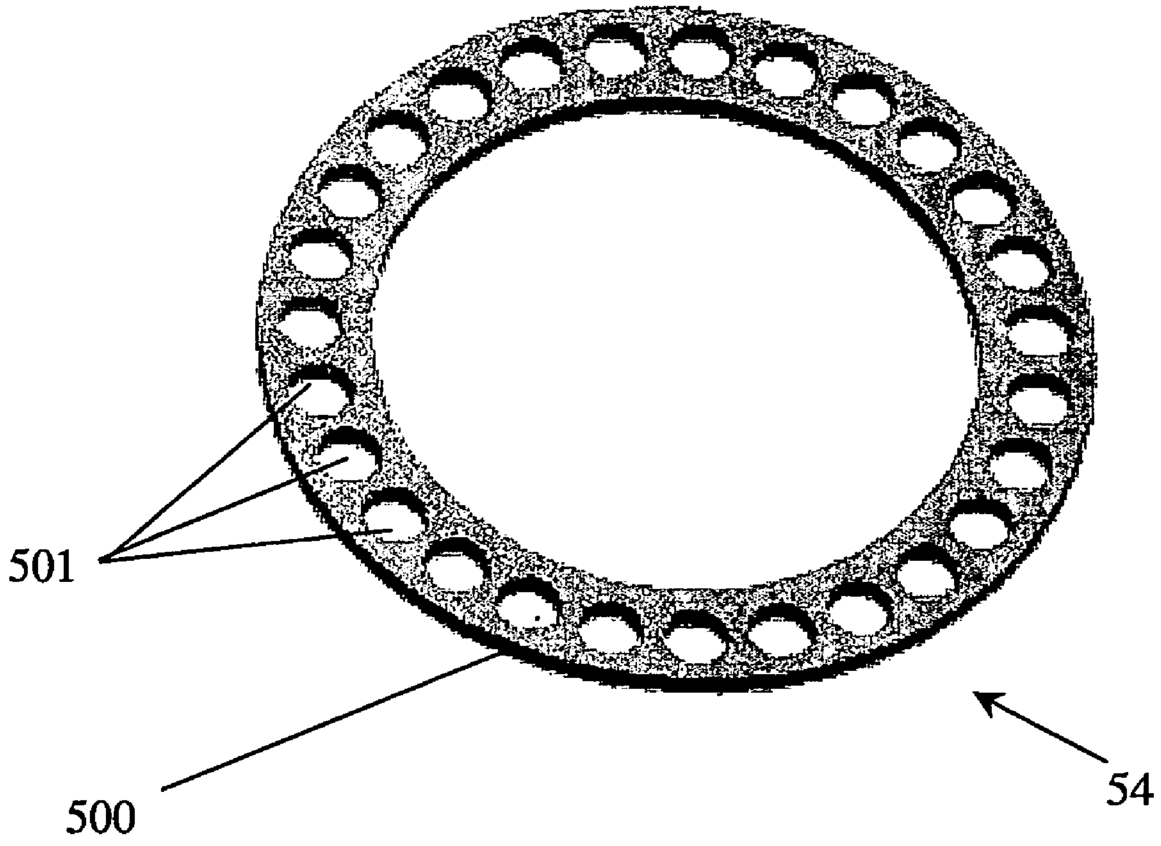
FIG. 6 shows a second harmonic cavity member for use with the klystron of FIG. 1.

Referring to FIG. 6, second harmonic cavities are used to improve the bunching efficiency and, in consequence, the klystron efficiency. In an embodiment, a second harmonic cavity structure (54) is formed by a member (500) which defines a set of individual $TM_{0,1,0}$ second harmonic cavities (501) for interacting with every single beamlet.

The above described embodiment is typified by a multi-beam klystron with 27 individual mini-klystron sectors, each of which produces about 4% of the total power obtained from the common output cavity. Each single sector can in fact be treated as an individual device.

Figure 7A:
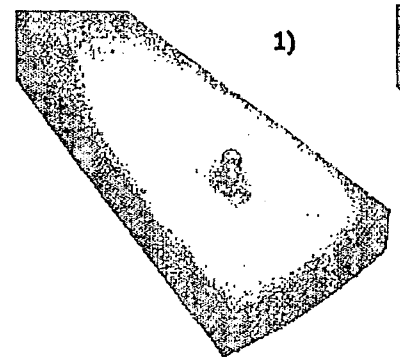
FIG. 7*a*-7*c* shows a field pattern of a second klystron embodying the invention.
Figure 7B:
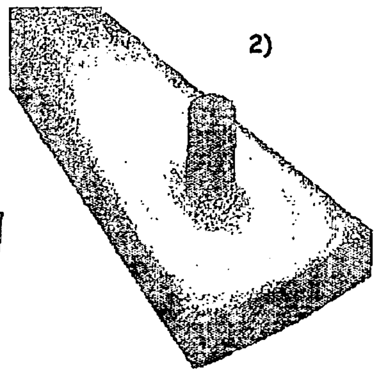
Figure 7C:
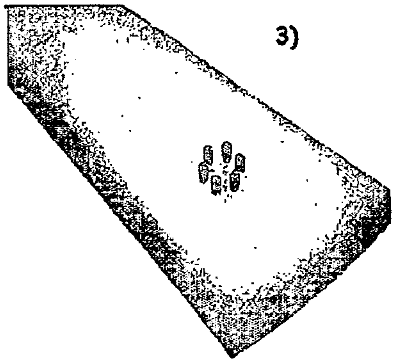

Referring to FIGS. 7*a*-7*c*, a second embodiment instead of using a single beamlet in this sector (FIG. 7*a*), uses plural mini-beamlets such that each sector acts like a mini MBK, thus creating a Super MBK (SMBK). In this situation the magnetic system as well as the second harmonic cavity remains unique for every mini MBK, i.e. for each sector.

Such a SMBK may have one of two configurations. The first way (FIG. 7*b*) uses a beam pipe with a larger radius, which can house at least 6 mini-beamlets. In this configuration the annular beam can also be considered as a very good candidate, but unfortunately the second harmonic cavity becomes rather inefficient. The second way (FIG. 7*c*) uses individual beam pipes for each mini beam. In the example shown there a six mini-beams and hence six mini beam pipes.

It is found that with the SMBK a significantly lower cathode voltage can be used (by about a factor of 2), and about 3 times lower single beam current is needed.

Modulators that provide the long voltage pulse (~100 μs) for either a MBK or SMBK device generate the same peak beam power. However, the beam voltage levels are different. If a classical modulator using a pulse transformer is considered then the lower voltage system enables a faster rise time since less turns are required on the secondary winding. The pulse transformer is also more compact due to the lower volt-seconds, and both leakage inductance and the self-capacitance of the windings are reduced. This improves the pulse response times and the energy efficiency by reducing the losses in the rise and fall of this voltage pulse. However, the voltage levels for both the MBK and SMBK are considerably lower than for an equivalent single beam klystron with the same output power, pulse width and duty cycle.

Several embodiments of klystrons embodying the invention have now been described. The invention is however not limited to any of the features of the embodiments but instead extends to the full scope of the appended claims.

The invention claimed is:

1. A klystron amplifier comprising means defining a plurality of electron beam paths and means defining plural damped disc-shaped cavities, wherein the plurality of electron beam paths cut the cavities and the Klystron further comprises an annular input cavity and an annular output cavity disposed around the substantially circular external periphery of respective disc-shaped cavities in communication therewith, the output cavity is arranged to receive RF power from the electron beams, wherein the cavities are arranged to support one of a single resonant rotating wave in a whispering-gallery mode, and a single resonant standing wave in a whispering-gallery mode.

2. A klystron according to claim 1, further comprising a wall defining a substantially disc-shaped cavity, the wall having one or more apertures for coupling thereto of electron beam energy, the cavity wall having a substantially circular outer periphery permitting coupling to a substantially annular input or output wave guide, wherein the said coupling is afforded by a plurality of windows distributed along the external periphery of the disc-shaped cavity.

3. A klystron according to claim 2, wherein each window comprises a ceramic member secured to a waveguide wall.

4. A klystron according to claim 1 comprising an input cavity, two gain cavities, a second harmonic cavity and an output cavity.

5. A klystron according to claim 1 wherein at least one cavity has an RF absorber member disposed therein.

6. A klystron according to claim 1, wherein each cavity has a vacuum port.

7. A klystron according to claim 6, wherein the port is axial.

8. A klystron according to claim 6 or 7, wherein the port has a diameter around 40 cm.

9. A klystron according to claim 6 having a circular RF absorber member.

10. A klystron according to claim 9 wherein the absorber is of SiC, and extends outwardly from the port by an amount such that the operating mode of the cavity is virtually unaffected.

11. A klystron according to claim 1 arranged to operate in a $TM_{m,n,q}$ mode.

12. A klystron according to claim 11, wherein m=11.

13. A klystron according to claim 1 having plural beam tubes.

14. A klystron according to claim 13 having one focussing solenoid per beam tube.

15. A klystron according to claim 1 arranged to operate in the frequency range 900-1000 MHz.

16. A klystron according to claim 1 arranged to operate at substantially 937 MHz

17. A klystron according to claim 1 arranged to provide tens of megawatts.

18. A klystron according to claim 17 arranged to provide about 50 MW.

19. A klystron according to claim 1 having a waveguide around each input and output cavity.

20. A klystron according to claim 1 arranged to operate with a power conversion efficiency over 65%.

21. A klystron according to claim 1 arranged to operate with a power conversion efficiency of over 70%.

22. A klystron according to claim 1 wherein the transverse beam spacing in a cavity is about half a wavelength.

23. A klystron according to claim 1 wherein the diameter of the beam pipe is small.

24. A klystron according to claim 1 wherein the diameter is about 1/16 of the operating wavelength.

25. A klystron according to claim 1 arranged to operate in a having a common vacuum pump and operating at $10^{-8}$ mbar or better.

26. A klystron amplifier comprising beam-path apparatus defining a plurality of electron beam paths and cavity apparatus defining plural damped disc-shaped cavities, wherein the plurality of electron beam paths cut the cavities and the Klystron further comprises an annular input cavity and an annular output cavity disposed around the substantially circular external periphery of respective disc-shaped cavities in communication therewith, the output cavity is arranged to receive RF power from the electron beams, wherein the cavities are arranged to support one of a single resonant rotating wave in a whispering-gallery mode, and a single resonant standing wave in a whispering-gallery mode.

* * * * *